(12) United States Patent  (10) Patent No.: US 8,525,248 B2
Mouli  (45) Date of Patent: Sep. 3, 2013

(54) MEMORY CELL COMPRISING A FLOATING BODY, A CHANNEL REGION, AND A DIODE

(71) Applicant: Micron Technology, Inc., Boise, ID (US)

(72) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/717,465

(22) Filed: Dec. 17, 2012

(65) Prior Publication Data

US 2013/0126908 A1    May 23, 2013

Related U.S. Application Data

(62) Division of application No. 13/396,414, filed on Feb. 14, 2012, now Pat. No. 8,357,967, which is a division of application No. 12/497,049, filed on Jul. 2, 2009, now Pat. No. 8,138,541.

(51) Int. Cl.
  *H01L 29/788* (2006.01)

(52) U.S. Cl.
  USPC ............................. 257/315; 257/316; 257/321

(58) Field of Classification Search
  USPC .......................................... 257/315, 316, 321
  See application file for complete search history.

(56) References Cited

U.S. PATENT DOCUMENTS

| 5,331,196 | A | 7/1994 | Lowrey et al. |
| 6,528,422 | B1 | 3/2003 | Huang et al. |
| 6,620,679 | B1 | 9/2003 | Tzeng et al. |
| 7,291,881 | B2 | 11/2007 | Kakoschke et al. |
| 7,655,973 | B2 * | 2/2010 | Mouli ............................ 257/330 |
| 7,919,800 | B2 | 4/2011 | Gonzalez et al. |
| 7,947,590 | B2 * | 5/2011 | Park et al. ...................... 438/585 |
| 8,089,801 | B2 | 1/2012 | Wang et al. |
| 2002/0005544 | A1 * | 1/2002 | Fujiwara ....................... 257/314 |

(Continued)

FOREIGN PATENT DOCUMENTS

| KR | 10-0770450 | 10/2007 |
| WO | PCT/US2010/037405 | 6/2010 |
| WO | PCT/US2010/037405 | 1/2012 |

OTHER PUBLICATIONS

Butt, Nauman Z., et al., "Scaling Limits of Double-Gate and Surround-Gate Z-RAM Cells", IEEE Transactions on Electron Devices, vol. 54, No. 9, Sep. 2007, pp. 2255-2262.

(Continued)

*Primary Examiner* — Ngan Ngo
(74) *Attorney, Agent, or Firm* — Wells St. John P.S.

(57) ABSTRACT

Some embodiments include memory cells that contain floating bodies and diodes. The diodes may be gated diodes having sections doped to a same conductivity type as the floating bodies, and such sections of the gated diodes may be electrically connected to the floating bodies. The floating bodies may be adjacent channel regions, and spaced from the channel regions by a dielectric structure. The dielectric structure of a memory cell may have a first portion between the floating body and the diode, and may have a second portion between the floating body and the channel region. The first portion may be more leaky to charge carriers than the second portion. The diodes may be formed in semiconductor material that is different from a semiconductor material that the channel regions are in. The floating bodies may have bulbous lower regions. Some embodiments include methods of making memory cells.

22 Claims, 7 Drawing Sheets

(56) References Cited

U.S. PATENT DOCUMENTS

| | | |
|---|---|---|
| 2005/0269614 A1 | 12/2005 | Tsou |
| 2006/0043420 A1 | 3/2006 | Kakoschke et al. |
| 2006/0292787 A1 | 12/2006 | Wang et al. |
| 2007/0049050 A1* | 3/2007 | Kakoschke et al. ........... 438/776 |
| 2008/0048298 A1 | 2/2008 | Taylor et al. |
| 2008/0099811 A1 | 5/2008 | Tak et al. |
| 2008/0169500 A1 | 7/2008 | Lojek |
| 2008/0205133 A1 | 8/2008 | Gonzalez et al. |
| 2008/0303063 A1 | 12/2008 | Hong et al. |
| 2009/0065835 A1 | 3/2009 | Kim et al. |
| 2009/0072279 A1 | 3/2009 | Moselund et al. |
| 2009/0108351 A1 | 4/2009 | Yang et al. |
| 2009/0185426 A1 | 7/2009 | Wang et al. |
| 2009/0219426 A1 | 9/2009 | Mouli |
| 2009/0302392 A1* | 12/2009 | Slesazeck ..................... 257/369 |
| 2010/0315884 A1 | 12/2010 | Toh et al. |
| 2011/0156044 A1 | 6/2011 | Lee et al. |
| 2011/0170364 A1 | 7/2011 | Gonzalez et al. |
| 2012/0258577 A1* | 10/2012 | Gonzalez et al. ............ 438/268 |

OTHER PUBLICATIONS

Chandramouli, V., et al., "Design Considerations for High Performance Avalanche Photodiode Multiplication Layers" IEEE Transactions on Electron Devices, vol. 41, No. 5, May 1994, pp. 648-654.

Fossum, Jerry G., eta l., "New Insights on "Capacitorless" Floating-Body DRAM Cells" IEEE Electron Device Letters, vol. 28, No. 6, Jun. 2007, pp. 513-516.

Lin, Chenglu, et al., "Studies on Novel SOI-Structure with AlN Film as Buried Insulator" Abstract, Proc. of ECS Symp, 2003 1 page.

Oshima, Kyosuke, et al., "SOI MOSFETs with Buried Alumina: Thermal and Electrical Aspects" Journal of The Electrochemical Society, 151 (4), 2004, pp. G257-G260.

Tang, Y.S., et al., "Characteristics of rare-earth element erbium implanted in silicon" Appl. Phys. Lett., vol. 55, No. 5, Jul. 31, 1989, pp. 432-433.

Wang, Peng-Fei, et al., "Design of a Novel Capacitorless DRAM Cell with Enhanced Retention Performance" IEEE, 2009, pp. 41-44 (+2 pages).

Wann, Hsing-jen, et al., "A Capacitorless DRAM Cell on SOI Substrate", IEEE, 1993, pp. 26.4.1-26.4.4.

\* cited by examiner

MEMORY CELL COMPRISING A FLOATING BODY, A CHANNEL REGION, AND A DIODE

RELATED PATENT DATA

This patent resulted from a divisional of U.S. patent application Ser. No. 13/396,414, which was filed Feb. 14, 2012, and which is hereby incorporated herein by reference; which resulted from a divisional of U.S. patent application Ser. No. 12/497,049, which was filed Jul. 2, 2009, which is now U.S. Pat. No. 8,138,541, and which is hereby incorporated herein by reference.

TECHNICAL FIELD

Memory cells, and methods of forming memory cells.

BACKGROUND

Dynamic access random memory (DRAM) is commonly utilized as rapid-access memory of computer systems. DRAM has traditionally utilized unit cells that contain a capacitor in combination with a transistor. In such traditional designs, a charge state of the capacitor is utilized to store and sense a memory bit.

Higher performance, lower cost, increased miniaturization of components, and greater packaging density of integrated circuits are ongoing goals of the computer industry. In pursuit of miniaturization, the capacitor/transistor combinations of traditional DRAM memory cells have been continually redesigned to achieve ever higher degrees of integration. However, it is becoming increasingly difficult to reduce the dimensions of DRAM capacitors while still maintaining sufficient capacitance to dependably store a memory bit.

The difficulties of reducing the dimensions of DRAM capacitors have led to the development of so-called capacitor-less memory devices. Such memory devices store charge on a component other than a capacitor. For instance, capacitor-less memory devices may use a floating body to store a memory bit (with the term "floating" indicating that the body is not in direct ohmic connection with a source of electrical potential, or, in other words, that the body is surrounded by electrically isolative material).

Although capacitor-less memory devices show some promise for ultimately taking the place of traditional DRAM memory cells, there are presently numerous difficulties encountered in attempting to utilize capacitor-less memory devices. One of the difficulties is that capacitor-less memory devices tend to be much more leaky than traditional capacitor/transistor memory cells, which means that the capacitor-less memory devices need to be refreshed at a higher rate than traditional memory cells. The higher refresh rate leads to higher power consumption which can drain batteries, and/or cause undesired heating. Another of the difficulties associated with capacitor-less memory devices is that the charge-storage components of such devices tend to be more difficult to charge than the capacitors of traditional DRAM, which can lead to excess power consumption, severe reliability issues and/or to inadequate device performance.

It is desired to develop improved capacitor-less memory cells.

DETAILED DESCRIPTION OF THE ILLUSTRATED EMBODIMENTS

New capacitor-less memory devices are described herein. Such devices may have numerous improvements relative to prior art floating body capacitor-less memory devices. For instance, the new capacitor-less memory devices described herein may have improved retention time and/or other data storage characteristics relative to prior art capacitor-less memory devices. Additionally, or alternatively, the new capacitor-less memory devices described herein may have improved programming characteristics relative to prior art capacitor-less memory devices. Additionally, or alternatively, the new capacitor-less memory devices described herein may have improved response time and/or reliability relative to prior art capacitor-less memory devices.

Figure 1:
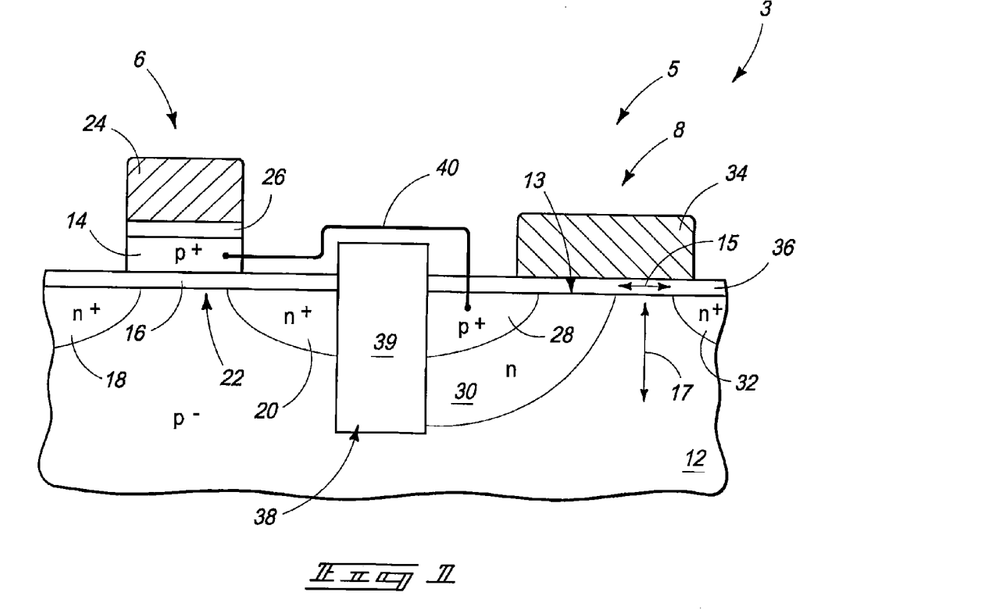
FIG. 1 is a diagrammatic cross-sectional view of a portion of a semiconductor construction illustrating an example embodiment memory cell.

FIG. 1 shows a portion of a semiconductor construction 3, and illustrates an example embodiment memory cell 5. The memory cell 5 includes a capacitor-less storage device 6 and a programming device 8. The programming device is configured to be utilized for programming the capacitor-less storage device 6.

Devices 6 and 8 are supported by a semiconductor base 12. The semiconductor base may comprise, for example, monocrystalline silicon lightly background doped with appropriate dopant. In the shown embodiment, base 12 is majority doped with p-type dopant, and is doped to a "p−" concentration.

The "p−" concentration is a relative term. Specifically, the p-type dopant concentration of a semiconductor material majority doped with p-type dopant may be expressed to be "p−", "p" or "p+"; in order of increasing dopant concentration. The particular amount of dopant corresponding to the "p−", "p" and "p+" concentration levels may vary depending on the application. In an example application, the "p−" level may correspond to a concentration of less than or equal to about $1\times10^{18}$ atoms/cm$^3$; the "p" level may correspond to a dopant concentration of from about $1\times10^{18}$ atoms/cm$^3$ to about $1\times10^{20}$ atoms/cm$^3$; and the "p+" level may correspond to a dopant concentration of at least about $1\times10^{20}$ atoms/cm$^3$. Similarly, if a semiconductor material is majority doped with n-type dopant, the n-type dopant concentration may be expressed to be "n−", "n" or "n+"; in order of increasing dopant concentration. The particular amount of dopant corresponding to the "n−", "n" and "n+" concentration levels may be, for example: a concentration of less than or equal to about $1\times10^{18}$ atoms/cm$^3$ for the "n−" level; a concentration of from about $1\times10^{18}$ atoms/cm$^3$ to about $1\times10^{22}$ atoms/cm$^3$ for the "n" level; and a concentration of greater than about $1\times10^{22}$ atoms/cm$^3$ for the "n+" level.

Base 12 may be considered to be a semiconductor substrate, where the term "semiconductor substrate" means any construction comprising semiconductive material, including, but not limited to, bulk semiconductive materials such as a semiconductive wafer (either alone or in assemblies comprising other materials thereon), and semiconductive material layers (either alone or in assemblies comprising other materials). In some embodiments, base 12 may correspond to a monocrystalline silicon wafer, and accordingly the semiconductor material of base 12 may consist essentially of, or consist of monocrystalline silicon. In other embodiments, the semiconductor material of base 12 may comprise, consist essentially of, or consist of other known, or yet be developed, semiconductor materials, such as, for example, germanium, gallium arsenide, etc.

The capacitor-less storage device 6 comprises a floating body 14 over base 12, and comprises a dielectric structure 16 between the floating body and the base.

The floating body may comprise doped semiconductor material. For instance, the floating body may comprise silicon and/or germanium; and may be doped to be either p-type or n-type. In the shown embodiment, the floating body is p-type doped, and is doped to a "p+" concentration. In some embodiments it may be preferred that the floating body comprise p-type doped germanium due to an advantage of higher boron activation of germanium relative to other semiconductor materials.

The floating body is illustrated as a planar body formed above base 12. In other embodiments, the floating body may be at least partially recessed into base 12, analogously to structures described below with reference to FIGS. 4-9.

The dielectric structure 16 may comprise any suitable composition or combination of compositions, and in some embodiments may comprise, consist essentially of, or consist of silicon dioxide. The dielectric structure 16 may comprise any suitable thickness, and in some embodiments may have a thickness of less than or equal to about 50 angstroms.

The capacitor-less storage device 6 comprises conductively-doped regions 18 and 20 extending into semiconductor base 12; and in the shown embodiment such regions are n-type majority doped to an "n+" concentration. The regions 18 and 20 may be referred to as source/drain regions in that the regions may correspond to a source and drain of a transistor device. In some embodiments, one or both of the regions 18 and 20 may be referred as an electrical node.

A channel region 22 extends between conductively-doped regions 18 and 20, and is directly beneath floating body 14. The channel region may be doped with a threshold voltage implant.

A sensing gate (or control gate) 24 is over floating body 14, and is spaced from the floating body by a dielectric structure 26. The dielectric structures 16 and 26 may be referred to as first and second dielectric structures, respectively, in some embodiments to distinguish the dielectric structures from one another. In some embodiments, floating body 14 may correspond to a floating gate, dielectric structure 16 may be referred to as a gate dielectric, and dielectric structure 26 may be referred to as an intergate dielectric.

The sensing gate is electrically conductive and may comprise any suitable composition or combination of compositions. For instance, the sensing gate may comprise one or more of various metals (for instance, platinum, titanium, tungsten, etc.), metal-containing compositions (for instance, metal nitride, metal silicide, etc.) and conductively-doped semiconductor materials (for instance, conductively-doped silicon, conductively-doped germanium, etc.).

The dielectric structure 26 may comprise any suitable composition or combination of compositions, and may, for example, comprise one or more of silicon dioxide and various high-k materials (with the term "high-k" indicating a dielectric constant greater than the dielectric constant of silicon oxide, and specifically, a dielectric constant greater than 3.9).

The sensing gate, together with the source/drain regions 18 and 20, may be considered to be sensing circuitry adjacent the floating body 14, and configured to detect a charge state of the floating body. The term "charge state" refers to the concentration of charge carriers in the floating body. In the shown embodiment, the floating body is p-type doped, and so the term "charge state" refers to a concentration of holes in the floating body. In embodiments in which the floating body is n-type doped (not shown) the term "charge state" refers to a concentration of electrons in the floating body.

The sensing gate may be part of an access line (such as a wordline) that extends in and out of the page relative to the cross-section of FIG. 1. The charge state of floating body 14 will alter electrical coupling between the access line and the channel region 22. Specifically, if floating body 14 is in an appropriate charge state, an electrical property of the access line (for instance, current or voltage) can induce current flow within the channel region to electrically couple source/drain regions 18 and 20 to one another; and if floating body 14 is in another charge state the electrical property of the access line will not induce the current flow within the channel region.

The charge state of the floating body is controlled with programming device 8. The programming device comprises doped regions 28, 30 and 32 within semiconductor base 12, a gate 34 over the base 12, and a dielectric structure 36 between gate 34 and base 12.

The region 28 is p-type majority doped (and specifically is doped to a "p+" concentration), while the regions 30 and 32 are n-type majority doped (and specifically are doped to an "n" concentration and an "n+" concentration, respectively).

The regions 28 and 30 together form a diode, and the gate 34 can control flow of carriers (i.e., holes or electrons) through such diode. Specifically, voltage (or current) at gate 34 may induce an electric field across the diode which controls flow of carriers through the diode. A diode having carrier flow therein controlled by an adjacent gate may be referred to as a "gated diode". The regions 28 and 30 may be referred to as first and second sections, respectively, of a gated diode. The region 28 has the same conductivity type as the floating body 14 of capacitor-less storage device 6 (p-type in the shown embodiment), while the region 30 has an opposite conductivity type to that of the floating body (n-type in the shown embodiment).

Gate 34 comprises electrically conductive material, and may comprise any suitable composition or combination of compositions. For instance, gate 34 may comprise one or more of various metals (for instance, platinum, titanium, tungsten, etc.), metal-containing compositions (for instance, metal nitride, metal silicide, etc.) and conductively-doped semiconductor materials (for instance, conductively-doped silicon, conductively-doped germanium, etc.). Gate 34 may be referred to as a programming gate, in that it is utilized for programming the capacitor-less storage device 6 (as discussed below). The gate 34 may be part of a conductive line that extends in and out of the page relative to the cross-section of FIG. 1.

The dielectric structure 36 may comprise any suitable composition or combination of compositions, and in some embodiments may comprise, consist essentially of, or consist of silicon dioxide. The dielectric structure 36 may be the same composition as the dielectric structure 16 in some embodiments, and may be a different composition than the dielectric structure 16 in other embodiments.

In the shown embodiment, the storage device 6 and the programming device 8 are laterally spaced from one another; and an isolation region 38 is provided within the space between the storage device and the programming device. The isolation region comprises electrically isolative material 39 formed within an opening that extends into semiconductor base 12. The electrically isolative material may comprise any suitable composition or combination of compositions, and may, for example, comprise one or both of silicon dioxide and silicon nitride. The isolation region may correspond to a conventional shallow trench isolation region. In the shown embodiment, isolative material 39 extends to a level that is above an upper surface of base 12. In other embodiments, an upper surface of material 39 may be coextensive with the upper surface of base 12, or may be recessed below an upper surface of base 12.

The region 28 of the gated diode of programming device 8 is electrically connected to the floating body 14 of capacitor-less storage device 6 through an electrical connection 40. Such electrical connection may utilize any suitable construction, and may, for example, utilize a wire comprised of one or more of various metals (for instance, platinum, titanium, tungsten, etc.), metal-containing compositions (for instance, metal nitride, metal silicide, etc.) and conductively-doped semiconductor materials (for instance, conductively-doped silicon, conductively-doped germanium, etc.).

In operation, regions 28 and 30 are comprised by a gated pn diode that is utilized for altering a memory state of storage device 6. The storage device may be considered to have two memory states. One of the states corresponds to a high concentration of holes retained by the floating body 14, and the other of the states corresponds to a lower concentration of holes retained by the floating body. The terms "high concentration of holes" and "low concentration of holes" are relative to one another, rather than absolute. Thus, the storage device is in the memory state corresponding to the "high concentration of holes" on the floating body if it has more holes retained on the floating body than the memory state corresponding to the "low concentration of holes". In some embodiments, an input current or voltage is provide at sensing gate 24, and the charge state of the floating body is detected by a difference in drive current through storage device 6 depending on whether the floating body is in a charged or uncharged state.

The storage device 6 is shifted from one of the memory states to the other through the flow of holes between floating body 14 and the region 28 of the pn diode. If holes are flowed onto the floating body, the storage device may be transformed into the memory state comprising a high concentration of holes retained by the floating body; and if holes are flowed from the floating body, the storage device may be transformed into the memory state comprising a low concentration of holes retained by the floating body.

In some embodiments, the "n" region 30 may be considered to be utilized for isolating the "p+" region 28 from the bulk material of base 12. In such embodiments, it may be desired for region 30 to be very thick, and to comprise a thickness of about one-half of the depth of isolation region 38. For instance, if isolation region 38 extends into substrate 12 to a depth of about 2000 angstroms, the region 30 may have a thickness of about 1000 angstroms.

The orientation of regions 28 and 30 of the pn diode may be tailored for specific applications to enable large-scale integration of memory cell 5. Base 12 is shown to have an upper surface 13. A horizontal direction 15 may be defined to extend along such upper surface. A vertical direction 17 may then be defined to extend orthogonally to the horizontal direction 15. In the shown embodiment, the region 30 of the pn diode extends both vertically and horizontally relative to the region 28. In other embodiments, region 30 may extend primarily horizontally relative to region 28, or may extend primarily vertically relative to region 28. For instance, programming device 8 may be formed over an isolative material as part of a silicon-on-insulator (SOI) construction. In such applications, the semiconductor material of base 12 will be a layer over the insulator, and the insulator may be used to electrically isolate the bottom of the region 28. Accordingly, the "p+" region 28 and "n" region 30 of the pn diode may be horizontally offset relative to one another, and not vertically offset relative to one another.

In some embodiments, the volume of the diode is tailored to achieve a desired amount of electron/hole pairs within the diode. A larger number of electron/hole pairs within the gated diode of FIG. 1 may lead to a lower programming voltage for providing charge to the floating body, which could be desirable in some embodiments.

The embodiment of FIG. 1 shows floating body 14 being majority doped with p-type dopant. In other embodiments, the floating body may be majority doped with n-type dopant; the dopant types of all of the regions 18, 20, 28, 30 and 32 can be reversed relative to the shown embodiment; and the background of doping of base 12 can be "n−" rather than the "p−" of the shown embodiment (or an n-well may be formed in the base to create an n-type-doped region of the base).

Although not shown, there would typically be one or more isolative materials surrounding the exposed surfaces of devices 6 and 8 to electrically insulate such devices from other circuitry (not shown) that may be adjacent the devices in an integrated circuit construction.

The construction of FIG. 1 is an example embodiment in which a gated diode may be utilized for programming a floating body within a capacitor-less memory cell. The utilization of the gated diode may overcome various problems associated with prior art methods of programming capacitor-less memory cells. For instance, the gated diode may enable more stringent control of the flow of carriers to and from the floating body than can be obtained with prior art methods. Also, prior art methods for programming floating bodies frequently utilize impact ionization to form holes in a floating p-type region; which may problematically lead to leakage mechanisms which adversely affect retention of the carriers on the floating body (for instance, hole-induced drain leakage). The utilization of the gated diode of FIG. 1 advantageously enables the floating body to be programmed with a mechanism other than impact ionization. Also, the utilization of the gated diode of FIG. 1 may enable the floating body to be programmed with lower operating voltages than are utilized in prior art methods.

Figure 2:
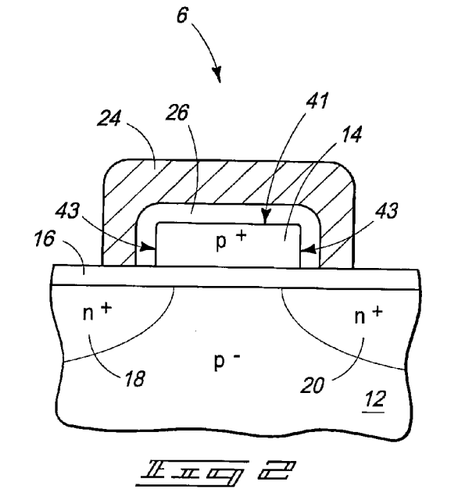
FIGS. 2 and 3 are diagrammatic cross-sectional views of portions of semiconductor constructions showing example embodiment structures that may be utilized alternatively to a structure shown in FIG. 1.
Figure 3:
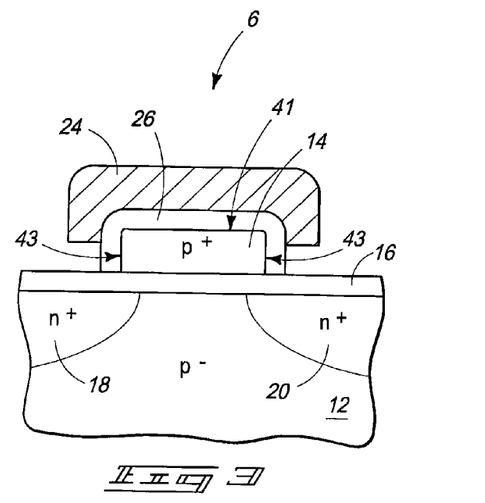

The sensing gate 24 of the construction of FIG. 1 is a planar gate provided over the planar floating body. In some embodiments, it may be advantageous for the sensing gate to wrap partially around the floating body to improve coupling between the sensing gate and the floating body. FIGS. 2 and 3 illustrate alternative embodiments of the storage device 6 of FIG. 1, with such alternative embodiments having sensing gates that wrap partially around a floating body. Identical numbering will be used to describe FIGS. 2 and 3 as is used to describe the memory cell of FIG. 1.

The floating bodies 14 of FIGS. 2 and 3 are shown to comprise top surfaces 41, and side surfaces 43 extending downwardly from the top surfaces. The dielectric structure 26 extends along and directly against the top surfaces and the side surfaces. The sensing gate 24 of FIG. 2 is shown to extend along the top surface 41 of the floating body 14, and also entirely along the side surfaces 43 of the floating body. In contrast, the sensing gate 24 of FIG. 3 is shown to extend along the top surface 41 of the floating body, but only partially along the side surfaces of the floating body.

The embodiment of FIG. 1 utilizes a gated diode during programming of a memory cell. FIGS. 4-9 illustrate embodiments in which non-gated diodes are utilized during programming of memory cells. Similar numbering will be used to describe FIGS. 4-9 as is used to describe the embodiment of FIG. 1, where appropriate.

Figure 4:
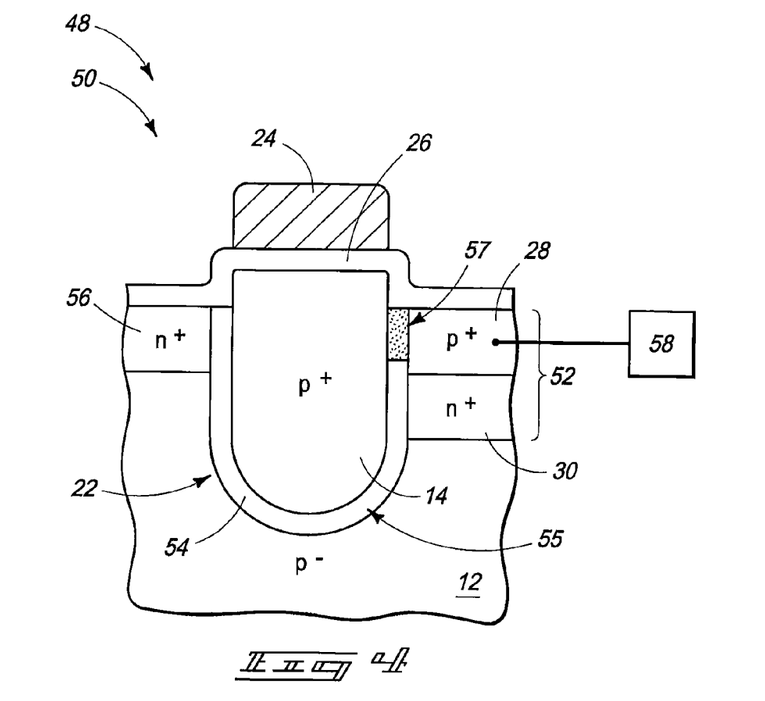
FIG. 4 is a diagrammatic cross-sectional view of a portion of a semiconductor construction illustrating another example embodiment memory cell.

Referring to FIG. 4, a portion of a semiconductor construction 48 is illustrated, with such portion comprising the semiconductor base 12 supporting a memory cell 50. The memory cell includes a floating body 14 recessed into semiconductor base 12, a diode 52 adjacent the floating body, and a dielectric structure 54 separating the floating body from the semiconductor base and the diode. The memory cell further comprises the sensing gate 24 over the floating body, and the dielectric structure 26 between the floating body and the sensing gate.

The semiconductor base 12 and the floating body 14 may comprise any of the materials discussed above relative to the base 12 and floating body 14 of FIG. 1. In some embodiments, the semiconductor base 12 and floating body 14 will each comprise a semiconductor material (for instance, silicon, germanium, etc.). In such embodiments, the semiconductor material of base 12 may be referred to as a first semiconductor material and the semiconductor material of floating body 14 may be referred to as a second semiconductor material, to aid in distinguishing the semiconductor materials of the base and floating body from one another. The semiconductor material of the floating body may be the same composition as the semiconductor material of the base in some embodiments, and may be compositionally different from the semiconductor material of the base in other embodiments.

The diode 52 comprises a first diode region 28 which is majority doped to a same conductivity type as the floating body 14 (p-type in the shown embodiment), and a second diode region 30 which is majority doped to an opposite conductivity type as the first diode region (n-type in the shown embodiment). In some embodiments, the conductivity type of the floating body and first diode region may be referred to as a first conductivity type, and the conductivity type of the second diode region may be referred to as a second conductivity type. Although the first conductivity type is p-type and a second conductivity type is n-type in the shown embodiment; in other embodiments the conductivity type of the floating body and first diode region may be n-type, and the conductivity type of the second diode region may be p-type. However, memory cells having p-type floating bodies may be easier to charge and less leaky than memory cells having n-type floating bodies; and thus may be more suitable for many applications than are memory cells having n-type floating bodies.

The memory cell 50 has an n-type doped region 56 within base 12 on an opposing side of the floating body 14 from the n-type doped second diode region 30. In some embodiments, the n-type doped regions 30 and 56 are utilized as source/drain regions (in addition to utilizing the region 30 as a second region of diode 52). A channel 22 extends within base 12 and between the n-type doped regions 30 and 56. The recessing of floating body 14 within base 12 may enable a longer channel to be formed across an area of semiconductor real estate than is formed along a planar floating body (for instance, the floating body of FIG. 1). The utilization of a longer channel may avoid problematic "short channel effects" in some embodiments.

The dielectric structure 54 may comprise any of the compositions discussed above regarding the dielectric structure 16 of FIG. 1. The dielectric structure 54 may be considered to comprise two portions, with a first portion 55 being between the floating body 14 and the channel region 22, and with a second portion region 57 being between the floating body and the first region 28 of diode 52. The second portion 57 is more leaky to carriers than the first portion 55, and stippling of portion 57 is utilized in FIG. 4 to illustrate that the portion 57 of the dielectric structure 54 is different than the portion 55.

Portion 57 may be treated to render portion 57 more leaky than portion 55, or may be formed to be compositionally different than portion 55. If portion 57 is treated, such treatment may comprise utilization of ionizing radiation to create damage within portion 57, and/or may comprise provision of one or more dopants (for instance, phosphorus, boron, etc.) within portion 57.

The first diode region 28 is electrically connected to circuitry 58 configured to bias diode 52 in either a forward or reverse direction. In operation, floating body 14 is programmed by either flowing holes onto the floating body, or by discharge holes off from the floating body.

If it is desired to flow holes onto the floating body, such holes may be flowed from the first diode region 28, through the leaky portion 57 of dielectric structure 54, and onto floating body 14. The leaky portion 57 may have a so-called "soft breakdown" as holes accumulate in the first region 28 of the diode, which can enable the holes to readily permeate the leaky portion 57 and accumulate on floating body 14. However, once the concentration of holes on the first region 28 reduces as the holes cross through the leaky portion 57 to accumulate on the floating body, the "soft breakdown" of portion 57 may subside so that the holes become trapped on the floating body. Accordingly, under some conditions, the leaky portion 57 may function as a one-way valve to enable holes to flow onto the floating body from the region 28 of the diode easier than the holes flow back from the floating body to the region 28 of the diode. This may aid in retention of charge on the floating body so that the memory cell 50 can function with less frequent refresh then prior art capacitor-less memory devices.

If it is desired to flow holes off from the floating body, circuitry 58 may be utilized to induce sufficient electrostatic force to pull the holes across the dielectric structure and into one or both of regions 28 and 30 of the diode and/or to induce a hard breakdown of the dielectric material of structure 54 so that holes readily pass off from floating body 14 into any of the adjacent materials of base 12 and diode 52.

The floating body 14 is shown to be partially recessed within base 12 in the embodiment of FIG. 4 so that a portion of the floating body extends above base 12. In other embodiments, the floating body may be recessed to a level such that an upper surface of the floating body is coextensive with an upper surface of base 12, or such that an upper surface of the floating body is recessed to a level beneath the upper surface of base 12.

Figure 5:
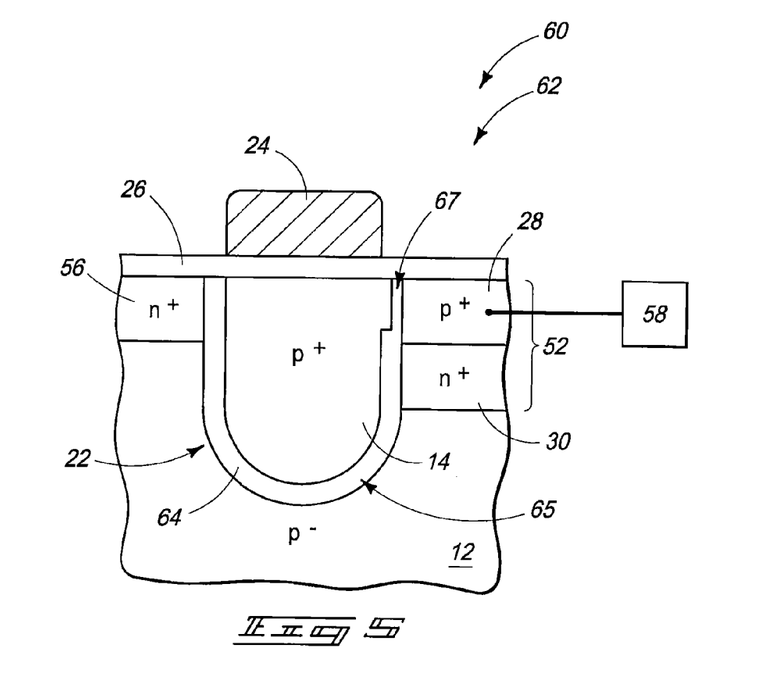
FIG. 5 is a diagrammatic cross-sectional view of a portion of a semiconductor construction illustrating another example embodiment memory cell.

Referring to FIG. 5, a portion of a semiconductor construction 60 is illustrated, with such portion comprising the semiconductor base 12 supporting a memory cell 62. The memory cell includes a floating body 14 recessed into semiconductor base 12, a diode 52 adjacent the floating body, and a dielectric structure 64 separating the floating body from the semiconductor base and the diode. The memory cell 62 further comprises the sensing gate 24 over the floating body, and the dielectric structure 26 between the floating body and the sensing gate.

The diode 52 comprises the first diode region 28 which is majority doped to a same conductivity type as the floating body 14 (p-type in the shown embodiment), and the second diode region 30 which is majority doped to an opposite conductivity type as the first diode region (n-type in the shown embodiment).

The memory cell 62 has the n-type doped region 56 within base 12 on an opposing side of the floating body 14 from the n-type doped second diode region 30, as discussed above regarding FIG. 4. The channel 22 extends within base 12 and between the n-type doped regions 30 and 56.

The dielectric structure 64 may comprise any of the compositions discussed above regarding the dielectric structure 16 of FIG. 1. The dielectric structure 64 may be considered to comprise two portions, with a first portion 65 being between the floating body 14 and the channel region 22, and with a second portion region 67 being between the floating body and the first region 28 of diode 52. The second portion 67 is thinner than the first portion 65 to render the second portion more leaky to carriers than the first portion.

The first diode region 28 is electrically connected to the circuitry 58 configured to bias diode 52 in either a forward or reverse direction. In operation, floating body 14 is programmed by either flowing holes onto the floating body, or off from the floating body, as discussed above regarding the memory cell of FIG. 4. The thinned portion 67 of the dielectric structure 64 can function analogously to the chemically modified portion 57 of the dielectric structure 54 of FIG. 4 during programming of memory cell 62.

The embodiments of FIGS. 4 and 5 illustrate applications in which modification of a portion of a dielectric structure adjacent a region of a diode may be utilized to render such portion of the dielectric structure "leaky" relative to a remainder of the dielectric structure. The leaky portion of the dielectric structure may be utilized to enhance programming of a capacitor-less memory cell. FIG. 4 illustrates an example embodiment in which chemical modification is utilized to increase the leakiness of a portion of the dielectric structure, and FIG. 5 illustrates an example embodiment in which structural modification is utilized to increase the leakiness of the portion of the dielectric structure. In other embodiments, the chemical modifications and structural modifications may be combined.

Figure 6:
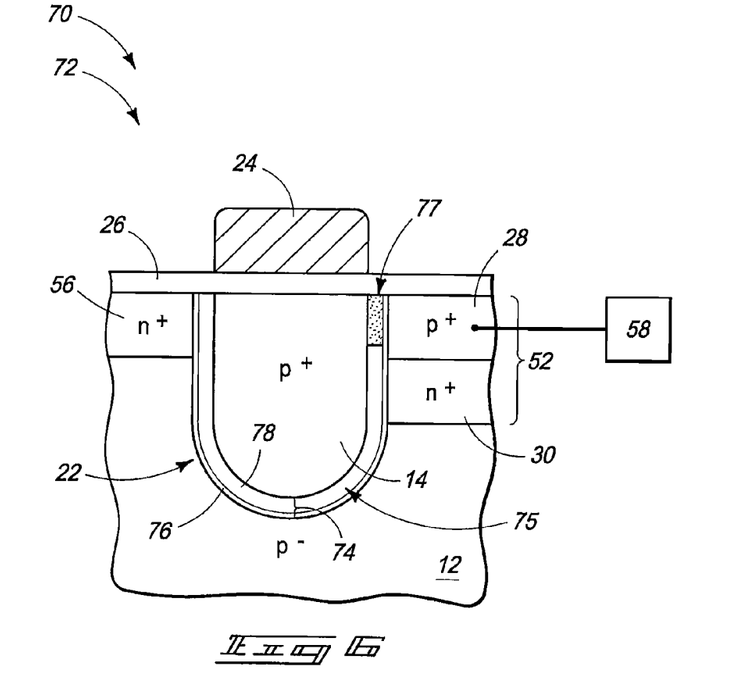
FIG. 6 is a diagrammatic cross-sectional view of a portion of a semiconductor construction illustrating another example embodiment memory cell.
Figure 7:
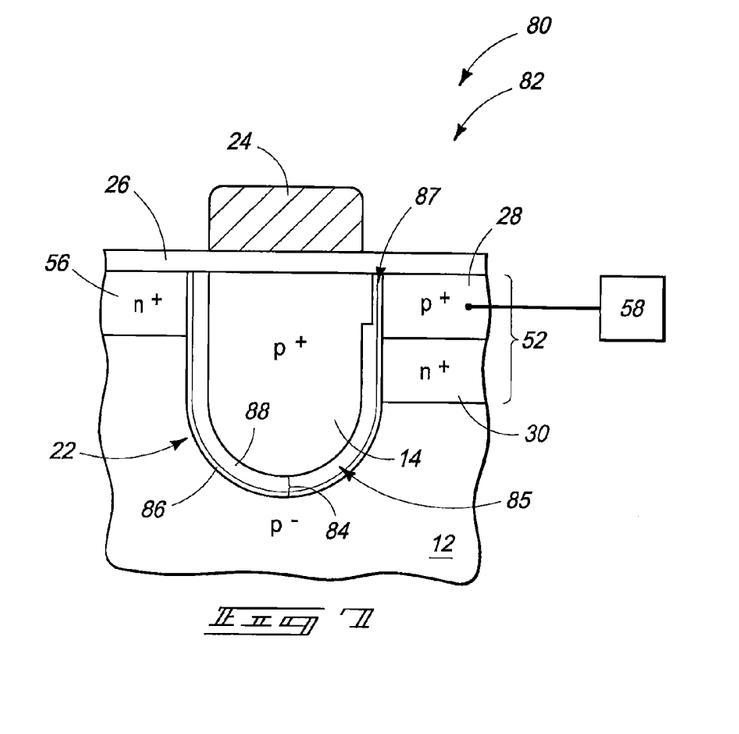
FIG. 7 is a diagrammatic cross-sectional view of a portion of a semiconductor construction illustrating another example embodiment memory cell.

In some embodiments, the dielectric structure provided between the channel region and floating body of a capacitor-less memory cell may comprise high-k dielectric. FIGS. 6 and 7 illustrate applications analogous to those of FIGS. 4 and 5, but specific for utilization with dielectric structures containing high-k materials.

Referring to FIG. 6, a portion of a semiconductor construction 70 is illustrated, with such portion comprising the semiconductor base 12 supporting a memory cell 72. The memory cell includes the floating body 14 recessed into semiconductor base 12, the diode 52 adjacent the floating body, and a dielectric structure 74 separating the floating body from the semiconductor base and the diode. The memory cell 72 further comprises the sensing gate 24 over the floating body, and the dielectric structure 26 between the floating body and the sensing gate.

The diode 52 comprises the first diode region 28 which is majority doped to a same conductivity type as the floating body 14 (p-type in the shown embodiment), and the second diode region 30 which is majority doped to an opposite conductivity type as the first diode region (n-type in the shown embodiment).

The memory cell 72 has the n-type doped region 56 within base 12 on an opposing side of the floating body 14 from the n-type doped second diode region 30, as discussed above regarding FIG. 4. The channel 22 extends within base 12 and between the n-type doped regions 30 and 56.

The dielectric structure 74 is analogous to the dielectric structure 54 of FIG. 4, but comprises two distinct layers. Specifically, the dielectric structure 74 comprises a layer 76 along base 12, and another layer 78 along the floating body 14.

The layer 76 may comprise, consist essentially of, or consist of silicon dioxide; and in some embodiments may correspond to so-called "native oxide" formed along an exposed surface of a silicon-containing base 12 after an opening is formed into the base, and prior to provision of dielectric layer 78 and floating body 14 within such opening. If layer 76 corresponds to "native oxide" the layer may consist of silicon dioxide, and may have a thickness of less or equal to about 10 angstroms (in some applications, less than or equal to about five angstroms). In some embodiments, layer 76 may be thin enough to allow direct tunneling of holes and/or electrons through the layer. The carriers (holes and/or electrons) tunneling into the dielectric layer will change the surface potential, and such may be used during the sensing of a charge state of the capacitor-less memory cell.

The layer 78 may comprise, consist essentially of, or consist of high-k dielectric material (for instance, zirconium oxide, hafnium oxide, aluminum oxide, etc.). In some embodiments, the layer 78 may be formed to a thickness that is three or more times thicker than the thickness of layer 76; and may, for example, be formed to a thickness of at least about 30 angstroms. Although dielectric structure 74 is shown comprising two layers, in other embodiments the dielectric structure may comprise more than two layers. If the dielectric structure 74 comprises more than two layers, at least one of the layers may be silicon dioxide, and at least one of the layers may be high-k dielectric.

The dielectric structure 74 comprises two portions 75 and 77 analogous to the portions 55 and 57 of the dielectric structure 54 of FIG. 4. However, in contrast to the dielectric structure of FIG. 4, the modified region 77 (shown with stippling in FIG. 6) only comprises modification to one of the two layers of dielectric structure 74 (specifically, the layer corresponding to the high-k dielectric 78). To the extent that the modification of region 77 comprises formation of damage within the dielectric structure 74, it can be advantageous that the damage region not directly contact the semiconductor material of diode 52 (otherwise the interface of the damaged dielectric and the semiconductor material of the diode may be too leaky). Accordingly, the thin dielectric layer 76 that is not modified may function as a barrier between the modified region 77 and the semiconductor material of diode 52.

A damage region may be specifically introduced into the high-k dielectric layer 78 relative to the silicon dioxide layer 76 through either carefully-controlled ionization of dielectric material of layer 78 and/or through chemical modification of material of layer 78 during or after deposition of such material. Although the shown damage region is confined to only one of the layers of dielectric structure 74, in other embodiments the damage region may extend through multiple layers of the dielectric structure. Further, in embodiments in which it is not problematic for the damage region to directly contact the semiconductor material of diode 52, the damage region may extend through all of the layers of dielectric structure 74.

The first diode region 28 is electrically connected to the circuitry 58 configured to bias diode 52 in either a forward or reverse direction. In operation, floating body 14 is programmed by either flowing holes onto the floating body, or off from the floating body, as discussed above regarding the memory cell of FIG. 4. The modified portion 77 of the dielectric structure 74 can function analogously to the modified portion 57 of the dielectric structure 54 of FIG. 4 during programming of memory cell 72.

Referring to FIG. 7, a portion of a semiconductor construction 80 is illustrated, with such portion comprising the semiconductor base 12 supporting a memory cell 82. The memory cell includes a floating body 14 recessed into semiconductor base 12, a diode 52 adjacent the floating body, and a dielectric structure 84 separating the floating body from the semiconductor base and the diode. The memory cell further comprises the sensing gate 24 over the floating body, and the dielectric structure 26 between the floating body and the sensing gate.

The dielectric structure 84 is analogous to the dielectric structure 64 of FIG. 5, but comprises two distinct layers. Specifically, the dielectric structure 84 comprises a layer 86 along base 12, and another layer 88 along the floating body 14. The layer 86 may comprise, consist essentially of, or consist of silicon dioxide; and in some embodiments may correspond to native oxide formed along an exposed surface of a silicon-containing base 12 after an opening is formed into the base, and prior to provision of dielectric layer 88 and floating body 14 within such opening. The layer 88 may comprise, consist essentially of, or consist of high-k dielectric material (for instance, zirconium oxide, hafnium oxide, aluminum oxide, etc.). In some embodiments, the layer 88 may be formed to a thickness that is three or more times thicker than the thickness of layer 86; and may, for example, be formed to a thickness of at least about 30 angstroms. Although dielectric structure 84 is shown comprising two layers, in other embodiments the dielectric structure 84 may comprise more than two layers; with the least one of the layers being silicon dioxide, and with at least one of the layers being high-k dielectric.

The dielectric structure 84 comprises two portions 85 and 87 analogous to the portions 65 and 67 of the dielectric structure 64 of FIG. 5. However, in contrast to the dielectric structure 64 of FIG. 5, only one of the two layers of dielectric structure 84 is thinned. The thinning of less than all of the layers of dielectric structure 84 provides a parameter which may enable leakiness of dielectric structure 84 to be tailored for particular applications.

The diode 52 comprises the first diode region 28 which is majority doped to a same conductivity type as the floating body 14 (p-type in the shown embodiment), and the second diode region 30 which is majority doped to an opposite conductivity type as the first diode region (n-type in the shown embodiment).

The memory cell 82 has the n-type doped region 56 within base 12 on an opposing side of the floating body 14 from the n-type doped second diode region 30, as discussed above regarding FIG. 5. The channel 22 extends within base 12 and between the n-type doped regions 30 and 56.

The first diode region 28 is electrically connected to the circuitry 58 configured to bias diode 52 in either a forward or reverse direction. In operation, floating body 14 is programmed by either flowing holes onto the floating body, or off from the floating body, as discussed above regarding the memory cell of FIG. 5.

Figure 8:
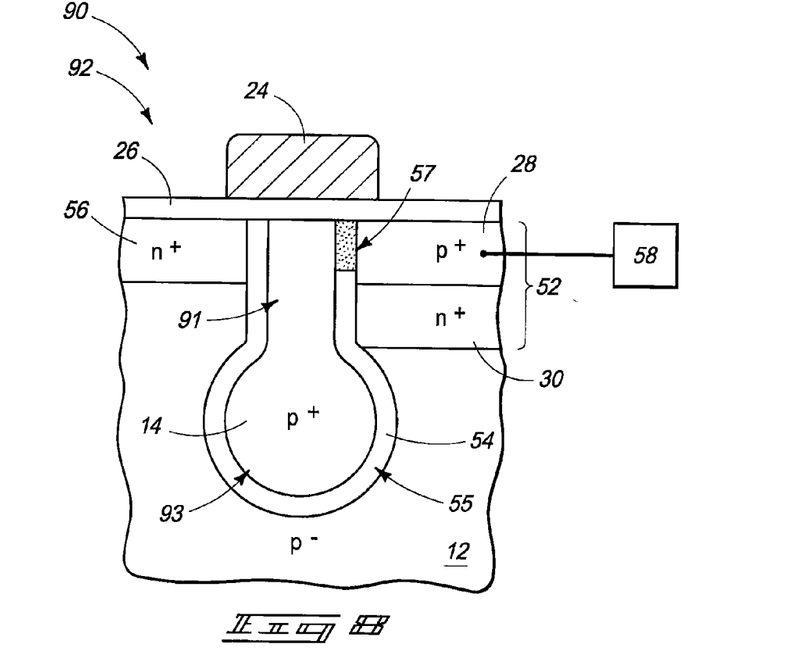
FIG. 8 is a diagrammatic cross-sectional view of a portion of a semiconductor construction illustrating another example embodiment memory cell.

In many applications, it would be desirable to tailor charge-retention characteristics of capacitor-less memory cells. FIG. 8 shows a semiconductor construction 90 containing a memory cell 92 that illustrates an embodiment for tailoring charge retention characteristics of the capacitor-less memory cell. Similar numbering will be used to describe the construction of FIG. 8 as is used above in describing the construction of FIG. 4, where appropriate.

The memory cell 92 includes floating body 14 recessed into semiconductor base 12, a diode 52 adjacent the floating body, and the dielectric structure 54 separating the floating body from the semiconductor base and the diode. The memory cell further comprises the sensing gate 24 over the floating body, and the dielectric structure 26 between the floating body and the sensing gate. The diode 52 comprises the first diode region 28 which is majority doped to a same conductivity type as the floating body 14 (p-type in the shown embodiment), and the second diode region 30 which is majority doped to an opposite conductivity type as the first diode region (n-type in the shown embodiment). The memory cell 92 also has the n-type doped region 56 within base 12, and on an opposing side of the floating body 14 from the n-type doped second diode region 30; and the channel 22 extending between the n-type doped regions 30 and 56. The dielectric structure 54 of FIG. 8 comprises the first and second portions 55 and 57 that were discussed above with reference to FIG. 4. The memory cell 92 also comprises the circuitry 58 to program the memory cell.

A difference between the memory cell 92 of FIG. 8 and the memory cell 50 of FIG. 4 is that the floating body 14 of FIG. 8 has a shape in the shown cross-section of a wide bulbous region 93 beneath a narrow stem region 91. Such shape may be formed by initially creating an opening in base 12 that has the wide bulbous lower region and narrow stem upper region, depositing dielectric material of structure 54 within such opening, and then depositing the material of floating body 14 to fill the opening. The opening having the wide bulbous lower region and narrow stem upper region may be formed with a combination of isotropic and anisotropic etches, utilizing processing analogous to that described in Wang et. al. (U.S. Patent Publication 2006/0292787).

The volume of floating body 14 may be tailored by tailoring the size and shape of the opening that the floating body is formed in, and such can tailor retention characteristics of the floating body (for instance, the amount of charge retained by the floating body, and/or the retention time of charge on the floating body).

Although the particular floating body shape of FIG. 8 is illustrated in a memory cell having a dielectric structure 54 with a modified region of the type previously described with reference to FIG. 4, in other embodiments the floating body shape of FIG. 8 may be utilized in combination with any of the other configurations described in this disclosure; and for example may be utilized in the memory cell 5 of FIG. 1, the memory cell 62 of FIG. 5, the memory cell 72 of FIG. 6, and the memory cell 82 of FIG. 7.

The embodiments of FIGS. 1-8 describe memory cells in which a diode is formed in a same semiconductor material as is utilized for a channel region. In other embodiments, the diode may be formed in a different semiconductor material than is utilized for the channel region, and such may provide additional control over programming characteristics and/or retention characteristics of a capacitor-less memory cell.

Figure 9:
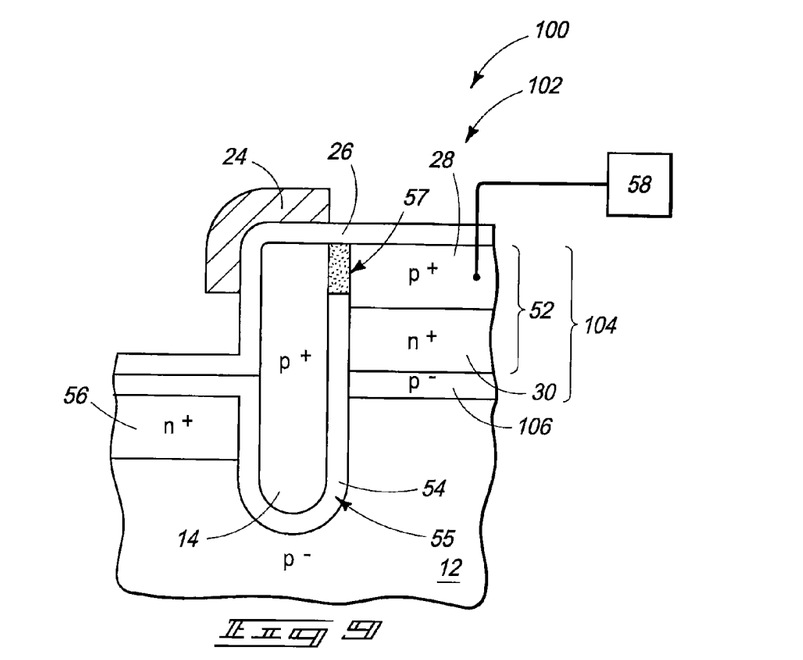
FIG. 9 is a diagrammatic cross-sectional view of a portion of a semiconductor construction illustrating another example embodiment memory cell.

FIG. 9 shows a semiconductor construction 100 containing a memory cell 102 that illustrates an embodiment for having a diode formed in a different semiconductor material than a channel region of a capacitor-less memory cell. Similar numbering will be used to describe the construction of FIG. 9 as is used above in describing the construction of FIG. 4, where appropriate.

The memory cell 102 includes floating 14 recessed into semiconductor base 12, a diode 52 adjacent the floating body, and the dielectric structure 54 separating the floating body from the semiconductor base 12 and the diode 52. The memory cell further comprises the sensing gate 24 over the floating body, and the dielectric structure 26 between the floating body and the sensing gate. In the embodiment of FIG. 4, only the dielectric structure 26 extended over doped region 56. In contrast, the dielectric structure 54 is shown extending over the doped region 56, in addition to the dielectric structure 26 extending over the doped region 56. This illustrates that either or both of dielectric structures 26 and 54 may extend over doped region 56 in various embodiments.

The diode 52 comprises the first diode region 28 which is majority doped to a same conductivity type as the floating body 14 (p-type in the shown embodiment), and the second diode region 30 which is majority doped to an opposite conductivity type as the first diode region (n-type in the shown embodiment). The memory cell 102 also has the n-type doped region 56 within base 12, and on an opposing side of the floating body 14 from the n-type doped second diode region 30; and the channel 22 extending between the n-type doped regions 30 and 56. The dielectric structure 54 of FIG. 9 comprises the first and second portions 55 and 57 that were discussed above with reference to FIG. 4.

A difference between the memory cell 102 of FIG. 9 and the memory cell 50 of FIG. 4 is that a semiconductor material 104 is formed over semiconductor base 12 in the embodiment of FIG. 9, and the diode is formed within semiconductor material 104 rather than within semiconductor base 12. In some embodiments, the semiconductor material of base 12 may be referred to as a first semiconductor material; the semiconductor material 104 may be referred to as a second semiconductor material which is different from the first semiconductor material; and the semiconductor material of floating body 14 may be referred to as a third semiconductor material which may be the same as one of the first and second semiconductor materials, or different from both of the first and second semiconductor materials. In some embodiments, the material 104 may be considered to define a diode section of memory cell 102 construction, and the semiconductor material of base 12 may be considered to define a channel region section of the memory cell.

The use of a second semiconductor material for the diode may enable band gap characteristics within the diode to be tailored to achieve desired performance parameters. For instance, in the embodiments of FIGS. 1-8 where the diode is formed in the same semiconductor material as the channel region of the memory cell, both the diode and the channel region may be formed in silicon. The maximum band gap within silicon is about 1.1 eV (electron volts, at about 300K), which limits the programming voltage that may be applied to the diode. In contrast, if the diode is formed in silicon carbide, the band gap increases to about 2.8 eV or greater (at about 300K), which can extend the useful range of programming voltage that may be utilized. Thus, in some embodiments the construction 102 of FIG. 9 will have a base 12 in which the semiconductor material consists essentially of, or consists of silicon; and will have a second semiconductor material 104 consisting essentially of, or consisting of a mixture of silicon and carbon (for instance, $Si_xC_y$, where x and y are numbers greater than zero). Further, if the diode is formed in a semiconductor material that contains two or more elements (for instance, silicon and carbon), the band gap may be tuned by adjusting the ratios of the elements (for instance, by adjusting an amount of carbon present in silicon carbide).

In the shown embodiment, a "p–" region 106 is provided within material 104 beneath diode 52 as a transition region between the diode and the "p–" background doped semiconductor material of base 12. Such places a pn junction at the bottom of diode 52 within material 104, rather than at the interface of base 12 and material 104; which can avoid problematic junction leakage that could otherwise occur.

The sensing gate 24 of FIG. 9 is shown to extend along a top and sidewall of the floating body 14. In other embodiments, the sensing gate may extend only along the top, or only along the sidewall.

Although the embodiment of FIG. 9 is illustrated with a dielectric structure 54 having a modified region of the type previously described with reference to FIG. 4, in other applications the embodiment of FIG. 9 may be utilized in combination with any of the other configurations described in this disclosure; and, for example, may be utilized in the memory cell 5 of FIG. 1, the memory cell 62 of FIG. 5, the memory cell 72 of FIG. 6, the memory cell 82 of FIG. 7, and the memory cell 92 of FIG. 8.

The various structures of FIGS. 1-9 may be fabricated utilizing any suitable methodologies, either existing, or yet to be developed. FIGS. 10-15 illustrate an example method for forming the memory cell of FIG. 9.

Figure 10:
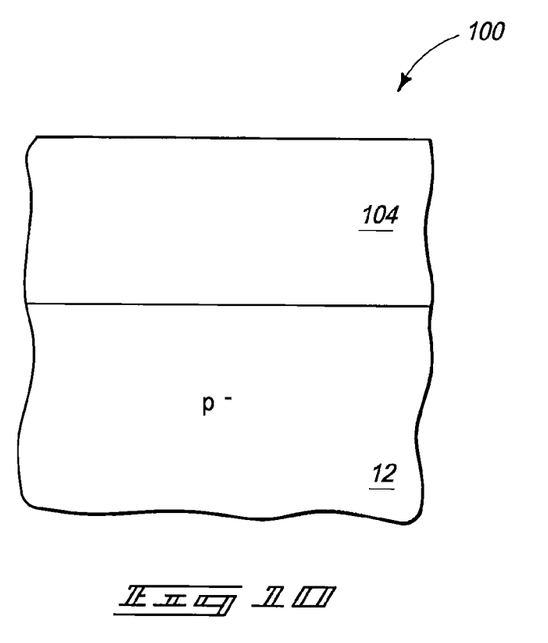
FIGS. 10-15 are diagrammatic cross-sectional views of a portion of a semiconductor construction illustrating example processing that may be utilized to form the example embodiment memory cell of FIG. 9.

Referring to FIG. 10, construction 100 is shown at a processing stage after the second semiconductor material 104 has been formed over the first semiconductor material of base 12. In some embodiments, the semiconductor material of base 12 may comprise, consist essentially of, or consist of silicon (for instance, monocrystalline silicon); and the semiconductor material 104 may comprise, consist essentially of, or consist of a mixture of silicon and carbon (and in some embodiments may correspond to silicon carbide). In such embodiments, the second semiconductor material may be formed by epitaxial growth from the first semiconductor material (with carbon doping occurring during or after the epitaxial growth of silicon). For instance, $Si_xC_y$ (where x and y are numbers greater than zero) may be epitaxially grown with processing utilizing a temperature of at least about 1000° C. If high temperature processing is utilized to form material 104, it can be advantageous to conduct such high temperature processing early in a process flow. Specifically, some materials and structures of the final integrated circuit design may be adversely affected by the high temperature processing, and thus it is advantageous to conduct the high temperature processing before such materials and structures have been formed.

Figure 11:
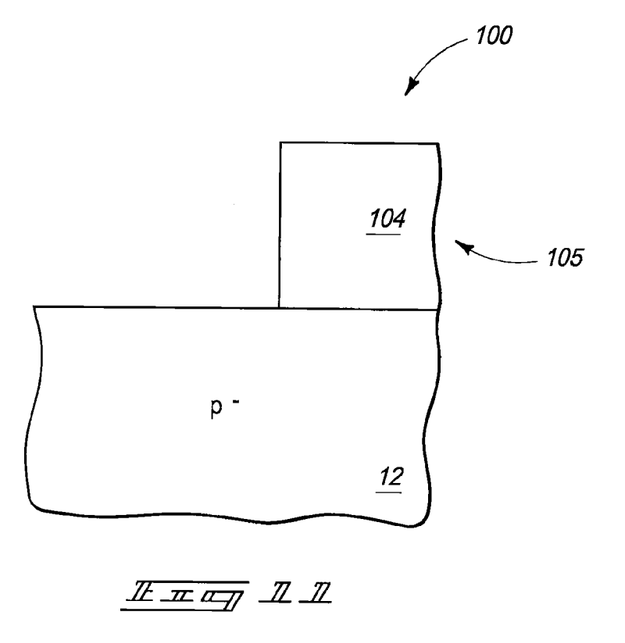

Referring to FIG. 11, material 104 is patterned to form a pedestal 105 over base 12. Such patterning may comprise, for example, utilization of a photolithographically-patterned mask to define the location of pedestal 105 during an etch of material 104, followed by removal of the mask to leave the construction of FIG. 11.

Figure 12:
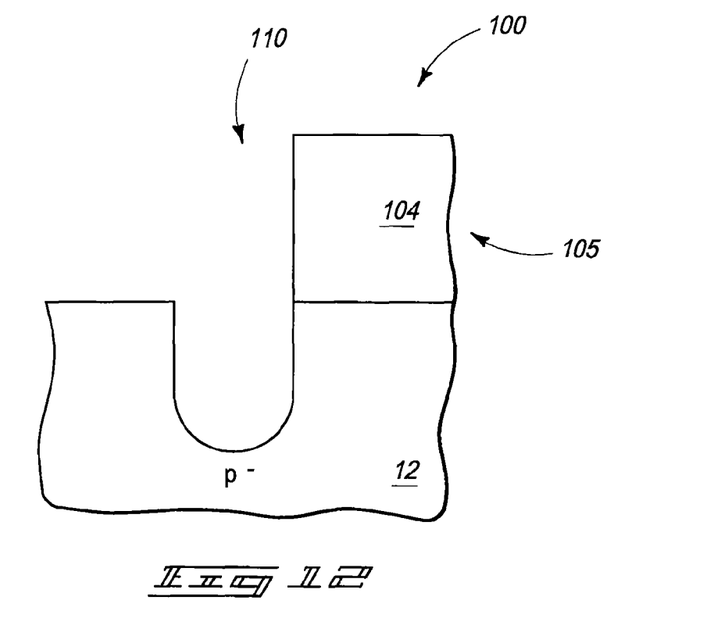

Referring to FIG. 12, an opening 110 is etched into substrate 12 adjacent pedestal 105. The formation of the opening may comprise, for example, utilization of a photolithographically-patterned mask to define the location of opening 110 during an etch into base 12, followed by removal of the mask to leave the construction of FIG. 12.

Figure 13:
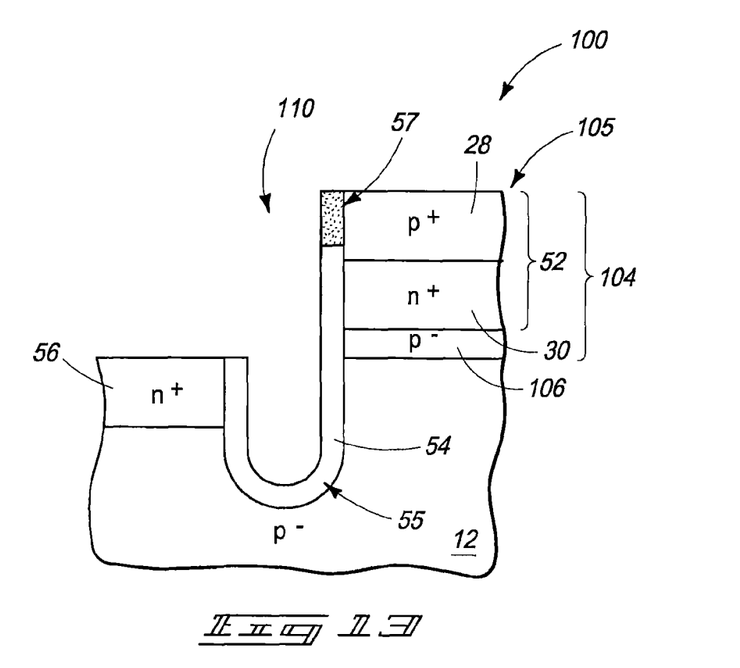

Referring to FIG. 13, dielectric structure 54 is formed within opening 110, doped regions 106, 30 and 28 are formed within pedestal 105, and doped region 56 is formed within base 12. The doped regions may be formed utilizing various photolithographically-patterned masks to define locations of the doped regions, and the masks may be removed subsequent to the formation of the doped regions. Dielectric material of structure 54 may be initially formed to extend across regions 28 and 56, and may then be patterned to extend only within opening 110 by utilizing a photolithographically-patterned mask to define the desired location of dielectric structure 54 while excess dielectric material is removed with an etch. The mask may be removed after such etch.

The dielectric structure 54 is shown comprising the unmodified portion 55 and modified portion 57. The modification of portion 57 may occur during deposition of dielectric material of structure 54 by forming portion 57 to have a different composition than portion 55; or after deposition of dielectric material of structure 54 and while using a mask to protect the portion of the dielectric material which is not to be modified. If the modification occurs after deposition of dielectric material of structure 54, the modification may comprise implant of dopant and/or impact ionization to create a damage region.

Figure 14:
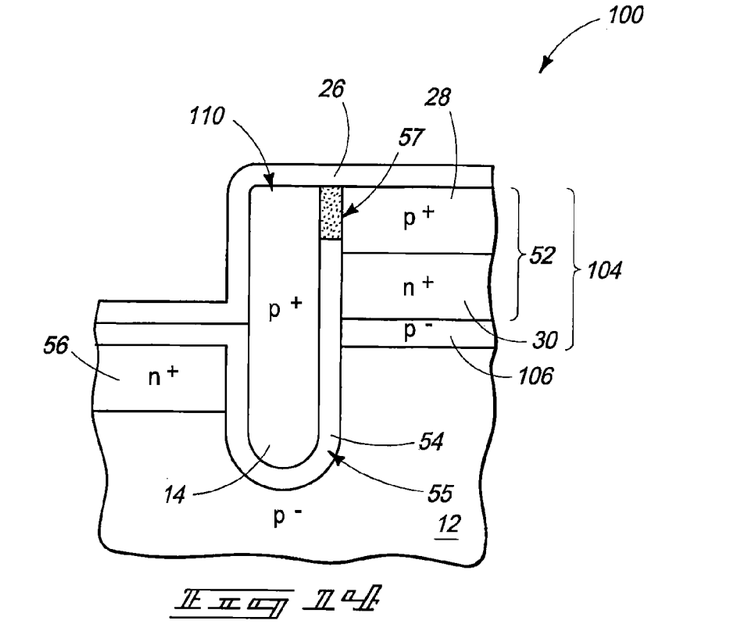

Referring to FIG. 14, floating body 14 is formed within opening 110, and subsequently dielectric structure 26 is formed over the floating body. The floating body may be formed by deposition of appropriate material, followed by an etch of excess material while using a mask to protect the material within opening 110, followed by removal of the mask.

Figure 15:
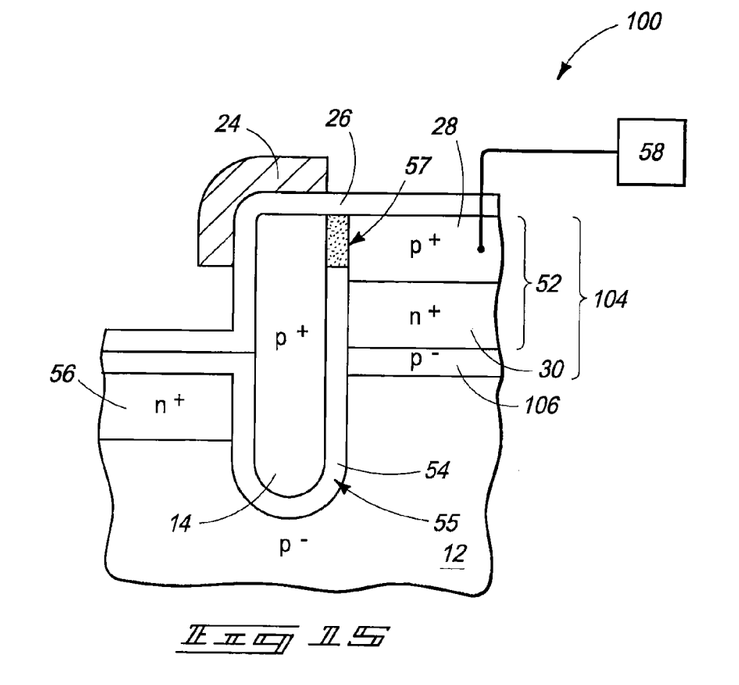

Referring to FIG. 15, sensing gate 24 is formed and patterned over dielectric structure 26, and an electrical connection is made to circuitry 58.

The embodiments described herein may provide numerous advantages over prior art capacitor-less memory cells. Some of the embodiments described herein may enhance retention time of capacitor-less memory cells. Some of the embodiments described herein may increase bit density of small features (for instance, non-planar geometries may lead to higher bit densities), while providing better electrostatic control than is available with prior art capacitor-less memory cells, and while providing higher sense margins than are available with prior art capacitor-less memory cells. Further, some embodiments may enhance reading and/or writing efficiency relative to prior art capacitor-less memory cells. Some embodiments may provide additional design margins beyond those available in the prior art (for instance, the alteration of the shape of the floating body shown in FIG. 8 may allow a volume of the floating body, and thus an amount of a floating body effect, to be adjusted). Some embodiments provide programming methodologies that are improved over prior art impact ionization technologies, and some embodiments reduce prior art problems associated with band-to-band tunneling.

The memory cells discussed above may be utilized in any electronic systems for which the cells are appropriately suited, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory cell, comprising:
    a floating body over a first semiconductor material, the floating body comprising a second semiconductor material doped to a first conductivity type;
    a channel region within the first semiconductor material and proximate the floating body;
    a diode within the first semiconductor material and adjacent the channel region; the diode having a first region doped to the first conductivity type, and having a second region doped to a second conductivity type that is opposite to the first conductivity type; and
    a dielectric structure; the dielectric structure having a first portion between the floating body and the channel region, and having a second portion between the floating body and the first region of the diode; the second portion of the dielectric structure being more leaky to charge carriers than the first portion of the dielectric structure.

2. The memory cell of claim 1 wherein the floating body is recessed into the first semiconductor material.

3. The memory cell of claim 1 wherein the floating body is recessed into the first semiconductor material; and wherein the recessed floating body has a shape, along at least one cross-section, of a wide bulbous region underlying a narrow stem region.

4. The memory cell of claim 1 wherein the dielectric structure comprises at least one layer of silicon dioxide and at least one layer of high-k dielectric material.

5. The memory cell of claim 1 wherein the second portion of the dielectric structure is thinner than the first portion.

6. The memory cell of claim 1 wherein the second portion of the dielectric structure is compositionally different from the first portion.

7. The memory cell of claim 1 wherein the second portion of the dielectric structure has damage regions formed therein and the first portion does not.

8. The memory cell of claim 1 further comprising sensing circuitry adjacent the floating body and configured to detect a charge state of the floating body; wherein the sensing circuitry comprises an access line over the floating body, and a pair of source/drain regions within the first semiconductor material; the source/drain regions being on opposing sides of the channel region from one another; one of the source/drain regions being the second region of the diode.

9. A memory cell, comprising:
    a semiconductor base comprising a pair of different semiconductor materials, one of the semiconductor materials of the base being a channel region section and the other being a diode section;
    a floating body over the semiconductor base, the floating body comprising a third semiconductor material which is doped to a first conductivity type;
    a channel region within the channel region section of the base and proximate the floating body;
    a diode within the diode section of the base and adjacent the channel region; the diode having a first region doped to the first conductivity type, and having a second region doped to a second conductivity type that is opposite to the first conductivity type; and
    a dielectric structure having a first portion between the floating body and the channel region, and having a second portion between the floating body and the first region of the diode.

10. The memory cell of claim 9 wherein the semiconductor material of the diode section comprises $Si_xC_y$, where x and y are numbers greater than zero.

11. The memory cell of claim 9 wherein the semiconductor material of the channel region section consists of silicon; and wherein the semiconductor material of the diode section consists of silicon and carbon.

12. The memory cell of claim 9 wherein the dielectric structure comprises at least one layer of silicon dioxide and at least one layer of high-k dielectric material.

13. The memory cell of claim 9 wherein the second portion of the dielectric structure is thinner than the first portion.

14. The memory cell of claim 9 wherein the second portion of the dielectric structure is compositionally different from the first portion.

15. The memory cell of claim 9 wherein the second portion of the dielectric structure has damage regions formed therein and the first portion does not.

16. The memory cell of claim 9 further comprising sensing circuitry adjacent the floating body and configured to detect a charge state of the floating body; wherein the sensing circuitry comprises an access line over the floating body, and a pair of source/drain regions within the semiconductor base; the source/drain regions being on opposing sides of the channel region from one another; one of the source/drain regions being the second region of the diode.

17. A memory cell, comprising:
   a semiconductor base;
   a floating body recessed into the semiconductor base; the floating body being of a semiconductor material which is doped to a first conductivity type;
   a dielectric structure between the floating body and the base; the dielectric structure comprising two or more different layers; at least one of the different layers being a high-k dielectric material;
   a channel region within the semiconductor base and proximate the floating body;
   a diode within the semiconductor base and adjacent the channel region; the diode having a first region doped to the first conductivity type, and having a second region doped to a second conductivity type that is opposite to the first conductivity type;
   wherein the dielectric structure has a first portion between the floating body and the channel region, and has a second portion between the floating body and the first region of the diode; and
   wherein the second portion of the dielectric structure is more leaky to charge carriers than the first portion of the dielectric structure.

18. The memory cell of claim 17 wherein the dielectric structure comprises one layer of high-k dielectric material and one layer of silicon dioxide.

19. The memory cell of claim 18 wherein the layer of silicon dioxide is between the layer of high-k dielectric material and the semiconductor base.

20. A memory cell, comprising:
   a semiconductor base;
   a floating body recessed into the semiconductor base; the recessed floating body comprising a shape, along at least one cross-section, of a wide bulbous region underlying a narrow stem region; the floating body being of a semiconductor material which is doped to a first conductivity type;
   a channel region within the semiconductor base and proximate the floating body;
   a diode within the semiconductor base and adjacent the channel region; the diode having a first region doped to the first conductivity type, and having a second region doped to a second conductivity type that is opposite to the first conductivity type; and
   a dielectric structure; the dielectric structure having a first portion between the floating body and the channel region, and having a second portion between the floating body and the first region of the diode.

21. The memory cell of claim 20 wherein the second portion of the dielectric structure is more leaky to charge carriers than the first portion of the gate dielectric.

22. The method of claim 1 wherein the diode comprises a p-type doped region over an n-type doped region, and wherein the second portion of the dielectric structure extends only partially along the p-type doped region of the diode.

* * * * *

UNITED STATES PATENT AND TRADEMARK OFFICE
CERTIFICATE OF CORRECTION

PATENT NO.        : 8,525,248 B2
APPLICATION NO.   : 13/717465
DATED             : September 3, 2013
INVENTOR(S)       : Chandra Mouli

Page 1 of 1

It is certified that error appears in the above-identified patent and that said Letters Patent is hereby corrected as shown below:

In the Claims

In column 18, line 33, in Claim 22, delete "method" and insert -- memory cell --, therefor.

Signed and Sealed this
Tenth Day of December, 2013

Margaret A. Focarino
*Commissioner for Patents of the United States Patent and Trademark Office*